US010222845B1

(12) United States Patent
Norton et al.

(10) Patent No.: US 10,222,845 B1
(45) Date of Patent: Mar. 5, 2019

(54) LIQUID COOLING TAMPER DETECTION

(71) Applicant: Hewlett Packard Enterprise Development LP, Houston, TX (US)

(72) Inventors: John Norton, Houston, TX (US); David A. Moore, Tomball, TX (US); Steve Weingart, Chapel Hill, NC (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 15/716,009

(22) Filed: Sep. 26, 2017

(51) Int. Cl.
*G06F 1/20* (2006.01)
*H05K 7/20* (2006.01)

(52) U.S. Cl.
CPC ........... *G06F 1/20* (2013.01); *H05K 7/20218* (2013.01); *G05B 2219/49215* (2013.01)

(58) Field of Classification Search
CPC ............................. G06F 1/20; H05K 7/20218
See application file for complete search history.

(56) References Cited

U.S. PATENT DOCUMENTS

| 4,630,036 | A | * | 12/1986 | Ford | G08B 21/187 |
| | | | | | 123/41.05 |
| 6,688,518 | B1 | | 2/2004 | Valencia et al. | |
| 7,567,884 | B2 | * | 7/2009 | Busch | B01D 53/88 |
| | | | | | 702/130 |
| 9,609,061 | B2 | | 3/2017 | Bang et al. | |
| 2005/0137942 | A1 | | 6/2005 | LaFleur | |
| 2006/0011641 | A1 | | 1/2006 | Sanderson | |
| 2009/0139317 | A1 | * | 6/2009 | Deivasigamani | F01P 11/18 |
| | | | | | 73/114.31 |

OTHER PUBLICATIONS

SKB Corporation; "3R series Roto Molded Cases"; Aug. 23, 2016; 2 pages.

* cited by examiner

*Primary Examiner* — Vincent H Tran
(74) *Attorney, Agent, or Firm* — Hewlett Packard Enterprise Patent Department

(57) ABSTRACT

In some examples, a computing system can include an exterior enclosure for the computing system, an electrical component within the enclosure, an interior cooling line within the enclosure to circulate coolant past the electrical component to remove heat generated by the electrical component, and an inlet coolant line port through the exterior enclosure to receive an inlet coolant line. The inlet coolant line port can, for example, include a sensor to detect tampering with an interior of the inlet coolant line.

15 Claims, 9 Drawing Sheets

US 10,222,845 B1

LIQUID COOLING TAMPER DETECTION

BACKGROUND

Computer security can refer to the protection of computing systems from theft, damage, disruption, or other threats. Such security can seek to protect against threats that come via network access (e.g., downloadable viruses and malware), as well as certain threats available only through physical access to the hardware. Data centers are typically designed to provide robust security, and to prevent unwanted physical access to computer equipment. However, some workloads may require additional levels of security. Moreover, future IT growth in emerging markets may lead to the deployment of computing systems in data centers and other locations in which local support cannot be entrusted with access to critical data and Intellectual Property ("IP").

DETAILED DESCRIPTION

Figure 1:
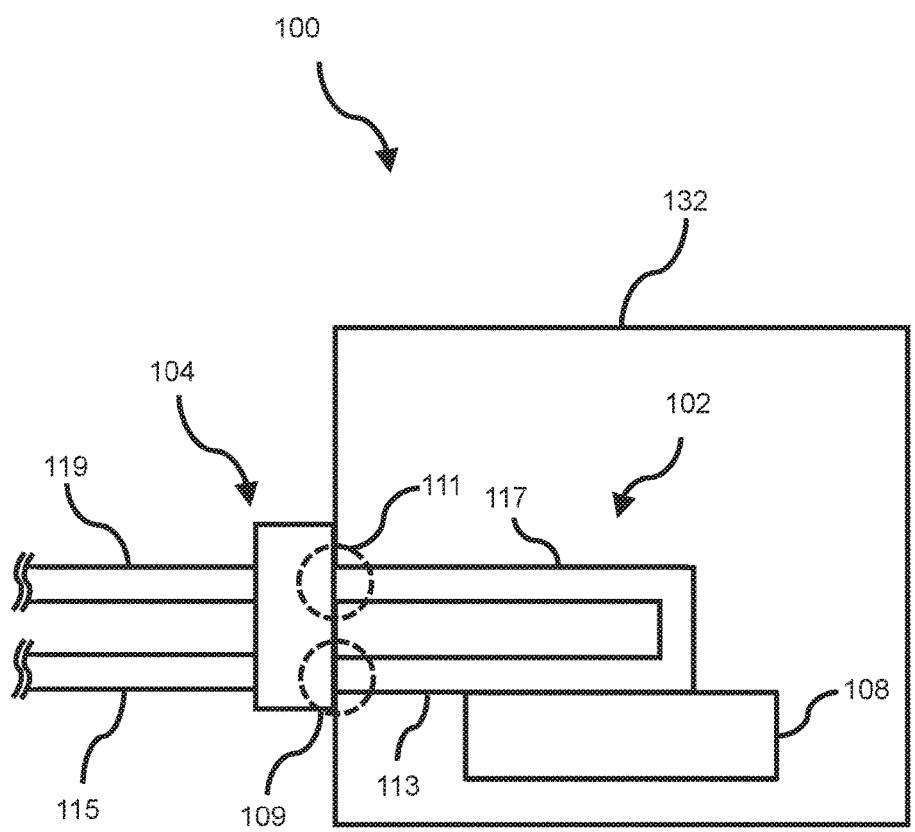
FIG. 1 is a diagram of a computing system according to an example.
Figure 2:
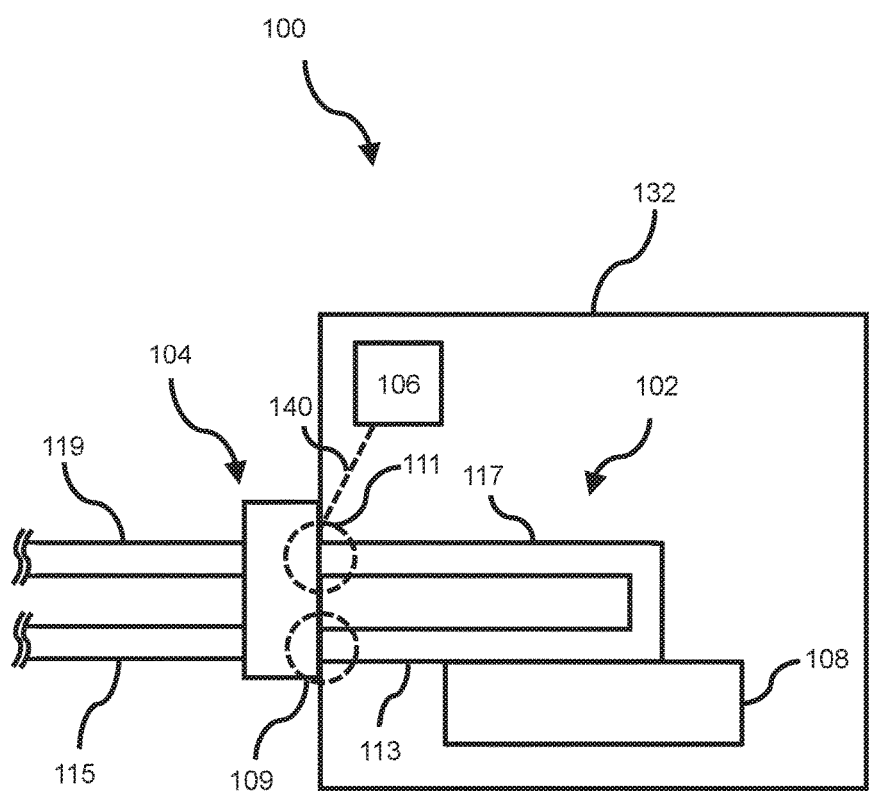
FIG. 2 is a diagram of a computing system according to another example.

The following discussion is directed to various examples of the disclosure. Although one or more of these examples may be preferred, the examples disclosed herein should not be interpreted, or otherwise used, as limiting the scope of the disclosure, including the claims. In addition, the following description has broad application, and the discussion of any example is meant only to be descriptive of that example, and not intended to intimate that the scope of the disclosure, including the claims, is limited to that example. Throughout the present disclosure, the terms "a" and "an" are intended to denote at least one of a particular element. In addition, as used herein, the term "includes" means includes but not limited to, the term "including" means including but not limited to. The term "based on" means based at least in part on.

Certain implementations of the present disclosure can enable improved levels of physical security and data protection for edge computing and remote computing, networking, and/or storage deployments, such as for example certain infrastructure computing equipment deployed on utility poles or cell towers, or other equipment that cannot reasonably be placed within a secured perimeter. In some implementations, a computing system can include a liquid coolant line to circulate liquid to cool an electronic component of the system. The system can further include a coolant security monitor coupled to the line to detect interior tampering of the line. For example, in some implementations, pressure and/or flow of coolant can be monitored and feedback from the monitoring can be used to detect tamper attempts. Certain implementations can be used to help prevent unwanted probing or other attacks on the system via the coolant lines, which can pose significant security risks in certain situations. Other advantages of implementations presented herein will be apparent upon review of the description and figures.

FIGS. 1-4 depict diagrams of various examples of a computing system 100. The computing systems 100 can, for example, include a liquid coolant line 102 and coolant security monitor 104 coupled to liquid coolant line 102 to detect interior tampering of coolant line 102. As described in further detail below, the various implementations may include additional components, functionality, etc. It is appreciated that these examples may include or refer to certain aspects of other implementations described herein (and vice-versa), but are not intended to be limiting towards other implementations described herein. Moreover, it is appreciated that certain aspects of these implementations may be applied to other implementations described herein. As but one example, although FIG. 1 does not expressly depict a storage medium, it is appreciated that in some implementations, computing system 100 of FIG. 1 may include a storage medium, such as for example storage medium 106 described with respect to FIG. 2.

As provided above, computing system 100 includes liquid coolant line 102, which can, for example, circulate liquid through computing system 100 to cool an electronic component 108 of system 100. Electronic component 108 can, for example, include certain computer equipment components, such as integrated circuits, CPUs, chipset, graphics cards, and hard disk drives, etc. In some implementations, component 108 can be any heat-generating component, including a component that is especially susceptible to temporary malfunction or permanent failure if overheated. In some implementations, electronic component 108 can be a processing resource (e.g., processing resource 120 in some implementations) that monitors the coolant line (e.g., security monitor 104). Likewise, in some implementations, electronic component 108 can be a processing resource (e.g., processing resource 120 in some implementations) that controls a liquid cooling pump (e.g., pump 150 of FIG. 7) or other aspect of computing system 100.

In some implementations, system 100 includes an inlet region 109 where coolant line 102 enters an exterior enclosure (e.g., enclosure housing 132 of computing system 100). Inlet region 109 can, for example, include portions of one or more components, such as an inlet region portion of enclosure housing 132, interior inlet liquid coolant line 113, security monitor 104, etc. Inlet region 109 can, in some implementations, refer to an area where exterior inlet liquid coolant line 115 passes through a tamper detection barrier 134 or an opening within tamper detection barrier 134. As provided herein, inlet region 109 can, for example, include an inlet gate 127 or another structure to detect and/or deter infiltration or tampering of interior inlet liquid coolant line 113 or exterior inlet liquid coolant line 115. It is appreciated that in some implementations, inlet region 109 can include a sensor (e.g., sensor 116) or another suitable mechanism to assist in detecting tampering or for another purpose.

In some implementations, system 100 includes an outlet region 111 where coolant line 102 enters an exterior enclosure housing 132 of computing system 100. Outlet region 111 can, for example, include portions of one or more components, such as an outlet region portion of enclosure housing 132, interior outlet liquid coolant line 117, security monitor 104, etc. Outlet region 111 can, in some implementations, refer to an area where exterior outlet liquid coolant line 119 passes through a tamper detection barrier 134 or an opening within tamper detection barrier 134. As provided herein, outlet region 111 can, for example, include an outlet gate 125 or another structure to detect and/or deter infiltration or tampering of interior outlet liquid coolant line 117 or exterior outlet liquid coolant line 119. It is appreciated that in some implementations, outlet region 111 can include a sensor (e.g., sensor 116) or another suitable mechanism to assist in detecting tampering or for another purpose.

As provided elsewhere herein, system 100 can include a liquid cooling system to cool heat generating components of system 100. Such a liquid cooling system can, for example, include at least one heat exchanger, at least one cold plate, and at least one expansion valve to manage dual-phase flow. The cold plate can, for example, transfer heat from electronic devices and components to cooling fluid in the various liquid coolant lines of coolant line 102 (e.g., lines 113, 115, 117, 119). The heat exchanger can, for example, transfer heat from cooling fluid in the lines to the air for removal. It is appreciated that the various liquid coolant lines (e.g., lines 113, 115, 117, 119) can be made of suitable tubing or any other suitable structure that encloses an interior bore or lumen within which a cooling fluid can circulate. In some implementations one or more of lines 113, 115, 117, 119 are flexible tubes, whereas in other implementations, such lines are rigid or semi-rigid.

As provided above, computing system 100 includes a coolant security monitor 104, which can, for example, be coupled to liquid coolant line 102 to detect interior tampering of coolant line 102. In some implementations, coolant security monitor 104 can monitor changes in a flow and/or pressure of coolant within coolant line 102 to detect interior tampering of coolant line 102. It is appreciated that other parameters related to the flow and/or presence of coolant within line 102 can be analyzed to detect interior tampering of coolant line 102. In some implementations, coolant security monitor 104 can detect the presence of a foreign object inserted within coolant line 102 to detect interior tampering of coolant line 102. For example, in some implementations, coolant security monitor 103 can detect the insertion of a probe within coolant line 102 based on readings from sensor (e.g., sensor 116) and/or based on disturbance of one or both of gates 125 and 127 within monitor 104. Coolant security monitor 104 can, for example, be coupled to the liquid coolant line to detect interior tampering of the coolant line at both the inlet region and the outlet region.

In some implementations, system 100 includes a tamper detection sensor 116, such as for example a temperature and/or flow sensor and/or other components to enable tamper detection within coolant line 102, coupled to liquid coolant line 102 of system 100 to detect tampering of coolant line 102. In some implementations, pressure and flow of coolant within coolant line 102 are monitored by sensor 116 and feedback is provided to logic of system 100 to assist in detecting tamper attempts.

In some implementations, coolant line 102 includes a gate (e.g., outlet gate 125 and inlet gate 127 of FIG. 6) that is sized to prevent passage of foreign objects through the cooling line while allowing coolant to flow through coolant line 102. Such gates can, for example, be electrically coupled to the coolant security module to notify the coolant security module of coolant line tampering. Such gates can, for example, be constructed from suitable sintered metal matrix material, which can, in some implementations, also allow filtration of the coolant. Tamper detection of the sintered matrix can be performed by embedding a security conductor loop to the matrix before sintering. Breakage or piercing of the matrix will result in continuity failure of the conductor. Such a gate (e.g., gate 125, 127) can, for example, be in the form of a security mesh. In some implementations, coolant line 102 can provide tamper detection through the use of metal matrix coolant passages, which can, for example, include embedded security wire to detect intrusion attempts.

Various example implementations for the present disclosure will now be described. It is appreciated that these examples may include or refer to certain aspects of other implementations described herein (and vice-versa), but are not intended to be limiting towards other implementations described herein. Moreover, it is appreciated that certain aspects of these implementations may be applied to other implementations described herein.

Figure 3:
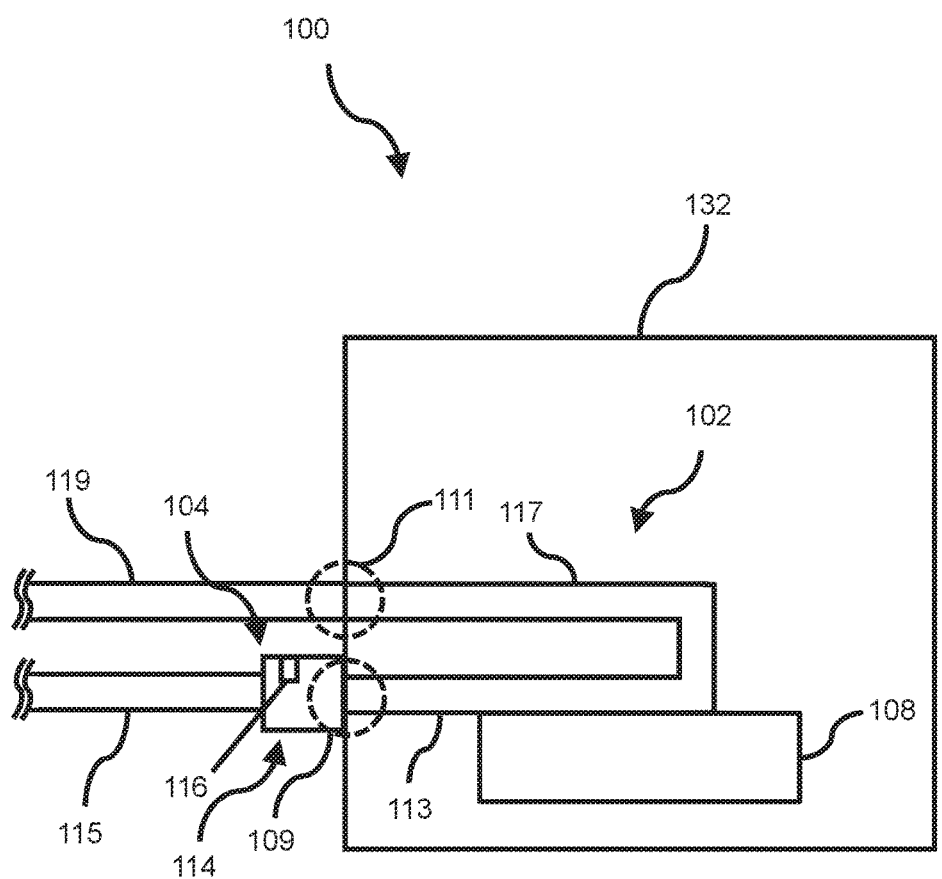
FIG. 3 is a diagram of a computing system according to another example.

FIG. 3 depicts an example computing system 100 of the present disclosure. System 100 of FIG. 3 includes an exterior enclosure housing 132 for system 100 and an electrical component 108 within enclosure housing 132. Such a system 100 can further include an interior cooling line 102 within enclosure housing 132 to circulate coolant past electrical component 108 to remove heat generated by electrical component 108. System 100 of FIG. 3 further includes an inlet coolant line port 114 through exterior enclosure housing 132 to receive inlet coolant line 102. Inlet coolant line port 114 can, for example, include one or more aspects or equipment within inlet region 109 and can, for example, include one or more components to allow fluid coupling of interior inlet coolant line 113 with exterior inlet cooling line 115. Inlet coolant line port 114 can, in some implementations, implement a quick-release type connectors to enable hot-pluggable connection and removal from other components. It is appreciated that inlet coolant line port 114 can be any other suitable type of port to allow fluid coupling. In some implementations, inlet coolant line port 114 can, for example, include a sensor, such as for example coolant security monitor 104, to detect tampering with an interior of the inlet coolant line.

Figure 4:
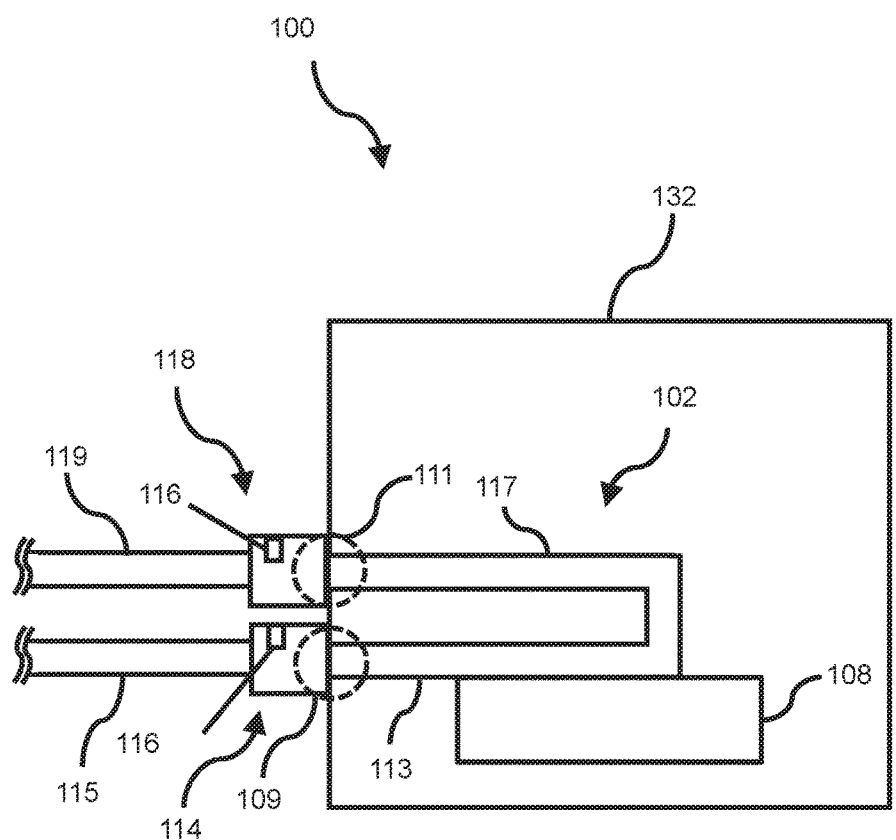
FIG. 4 is a diagram of a computing system according to another example.

FIG. 4 depicts an example computing system 100 of the present disclosure. System 100 of FIG. 4 includes the various aspects of system 100 of FIG. 3 and further includes an outlet coolant line port 118 through exterior enclosure housing 132 to receive an outlet coolant line. Outlet coolant line port 118 can, for example, include one or more aspects or equipment within outlet region 111 and can, for example, include one or more components to allow fluid coupling of interior outlet coolant line 117 with exterior outlet cooling line 119. Outlet coolant line port 118 can, in some implementations, implement a quick-release type connectors to enable hot-pluggable connection and removal from other components. It is appreciated that outlet coolant line port 118 can be any other suitable type of port to allow fluid coupling. In some implementations, outlet coolant line port 118 can, for example, include a tamper detection sensor 116, such as for example a sensor within coolant security monitor 104, to detect tampering with an interior of outlet coolant line 102.

Figure 5:
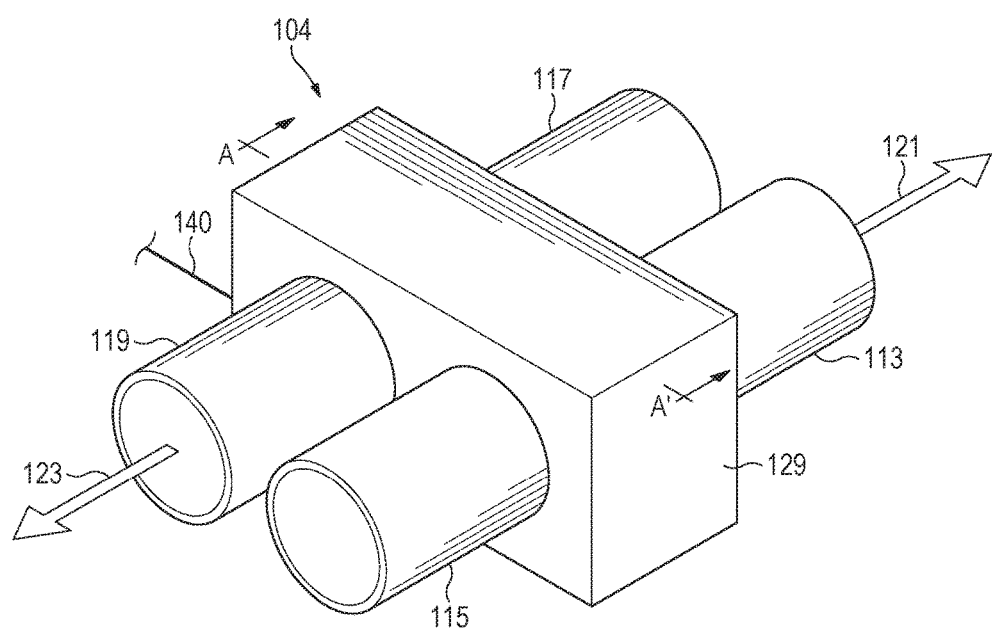
FIG. 5 is a diagram of a portion of a computing system according to an example.
Figure 6:
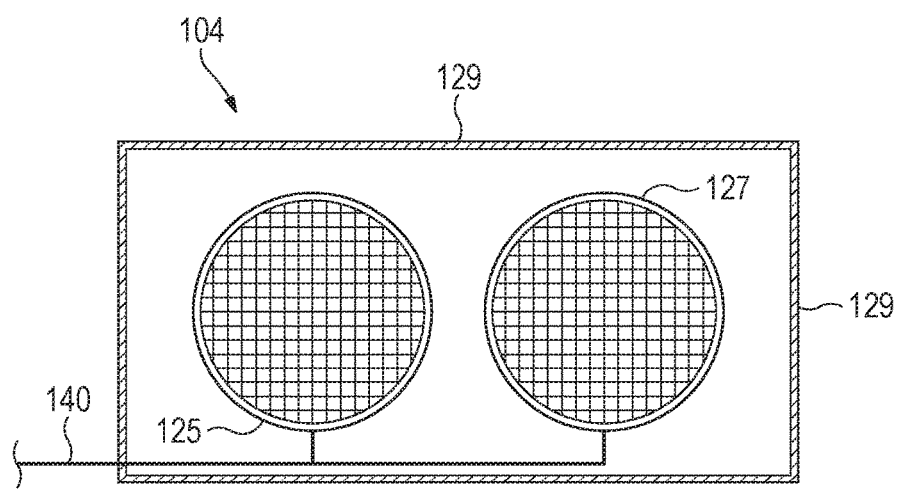
FIG. 6 is a cross-sectional view of the portion of FIG. 5 along line A-A'.

FIGS. 5-6 are views of a portion of system 100 including security monitor 104 and elements of coolant line 102. In particular, FIG. 5 depicts a perspective view of the portion of system 100 and FIG. 6 depicts a cross-sectional view of the portion of FIG. 5 alone line A-A'. As depicted in FIG. 5, security monitor 104 includes a housing 129 that secures elements of coolant line 102 such that inlet liquid coolant flows in direction 121 and that outlet liquid coolant flows in direction 123. In the example of FIG. 5, housing 129 divides interior inlet coolant line 113 from exterior inlet coolant line 115 and divides interior outlet coolant line 117 from exterior outlet coolant line 119. It is appreciated that the interior inlet coolant line 113 and exterior inlet coolant line 115 can, in some implementations, be distinct pieces joined together at monitor 104, whereas in other implementations, interior inlet coolant line 113 and exterior inlet coolant line 115 can be a single piece of coolant line that passes through monitor 104. Likewise, it is appreciated that the interior outlet coolant line 117 and exterior outlet coolant line 119 can, in some implementations, be distinct pieces joined together at monitor 104, whereas in other implementations, interior outlet coolant line 117 and exterior outlet coolant line 119 can be a single piece of coolant line that passes through monitor 104.

As depicted in FIG. 6, housing 129 can include openings sized to receive outlet gate 125 and inlet gate 127, which are described in further detail elsewhere herein. Housing 129 can, for example, include openings, grooves, and/or other structures to secure a communication link 140 for outlet gate 125 and/or inlet gate 127. Link 140 of FIG. 6 can, for example, communicate tamper detection signals from outlet gate 125, inlet gate 127, and logic of system 100. It is appreciated that in some implementations, monitor 104 may include separate communication links 140 for outlet gate 125 and inlet gate 127.

Figure 7:
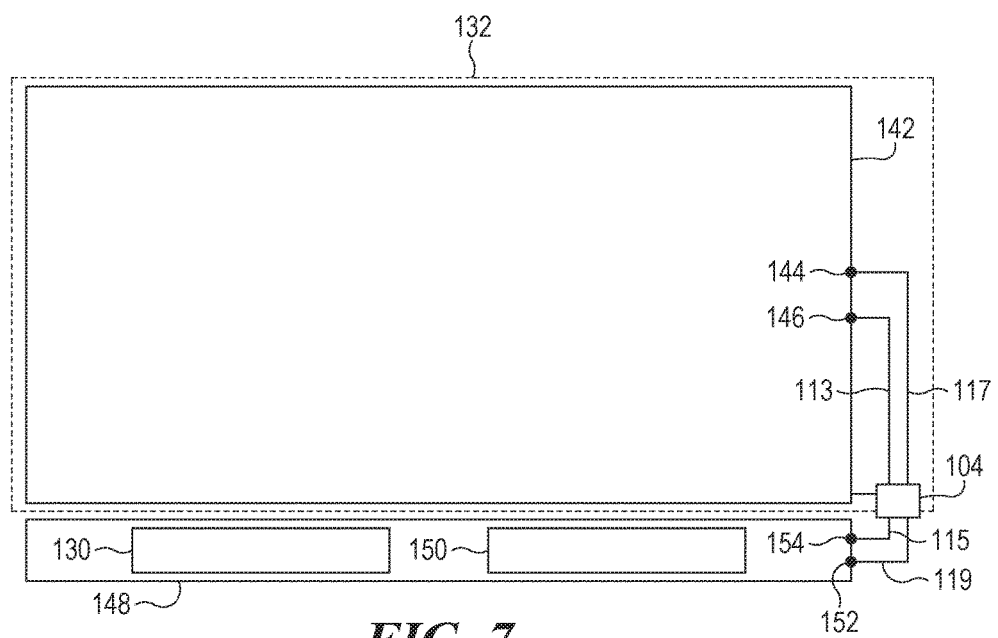
FIG. 7 is a diagram of a computing system according to another example.

FIG. 7 depicts a diagram of an example liquid cooling security system 100. System 100 of FIG. 7 includes an exterior enclosure housing 132 with a tamper detection security monitor 104 which can, for example, detect intrusion or tampering with in interior of coolant line 102. System 100 of FIG. 7 further includes an interior enclosure housing 142 to house one or more heat generating electronic components (e.g., component 108) of system 100. Cool liquid coolant within line 113 that has successfully passed through monitor 104 can pass through interior enclosure housing 142 via cool coolant port 146 and exhaust warm liquid coolant that has been used to cool electronic components of system 100 via system warm coolant port 144.

As depicted in FIG. 7, system 100 can include a power and pump enclosure 148 that can, for example, house one or more power backup cells 130 and liquid cooling pump 150. Pump 150 used with system 100 can, for example, include any suitable pump for a liquid cooling system. Pump 150 can, for example, be in the form of a positive displacement mechanical pump. Pump 150 can include an inlet port 152 and an output port 154 which can, for example, connect to quick-release type connectors to enable hot-pluggable connection and removal of pump 150. Pump 150 can, for example, be driven by stepper motor coils that rotate an internally-threaded rotor that moves a pump screw. A plunger can be connected to the pump screw to discharge liquid inside pump 150 through output port 154. A sensor inside pump 150 can, for example, detect motion of the plunger and generate a pulse electrical signal that can be used for control and monitoring operations. Pump discharge and suction volumes can, for example, be controlled by monitoring pulse number and selectively driving the motor coils. It is appreciated that alternative pump technologies may otherwise be used for an electronic liquid cooling system, for example using piezo-electric crystals and/or electro-osmosis.

Backup energy source 130 can, for example, be used to run a clock circuit and retain configuration memory while system 100 is turned off. Backup energy source 130 can, for example, be in the form of a CMOS storage backup energy source or BIOS backup energy source. It is appreciated that backup energy source 130 can In some implementations, backup energy source 130 can be integrated as part of an uninterruptible power supply (UPS), to provide power to system 100 for a variable period after a power failure (e.g., a period to allow system 100 to be shut down gracefully. Backup energy source 130 can, for example, be in the form of a battery, such as a large valve regulated lead-acid batteries, wet cell lead-acid, nickel cadmium, lithium ion, or any other suitable battery type. Backup energy source 130 can, for example, be used to ensure active monitoring while in shipping and in power loss events. In some implementations, system 100 can indicate tampering upon disabling or disruption in service of backup energy source 130.

Figure 8:
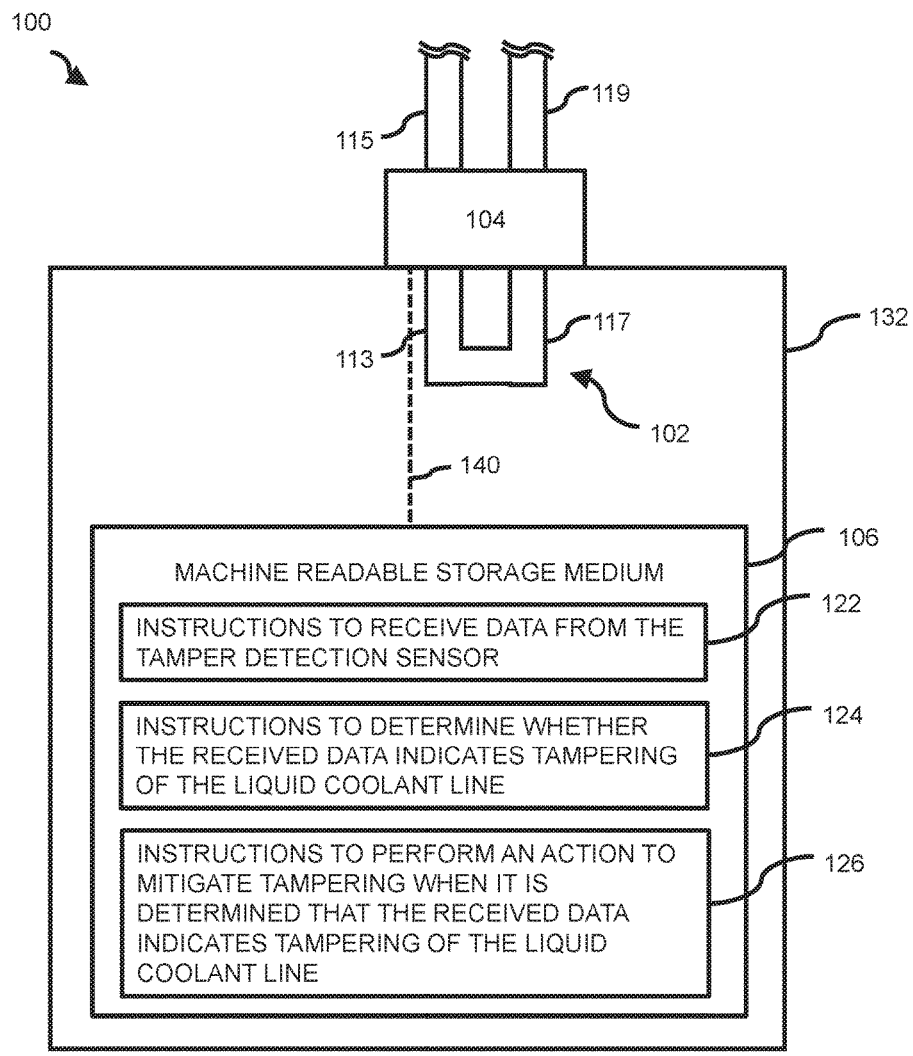
FIG. 8 is a diagram of a computing system according to another example.
Figure 9:
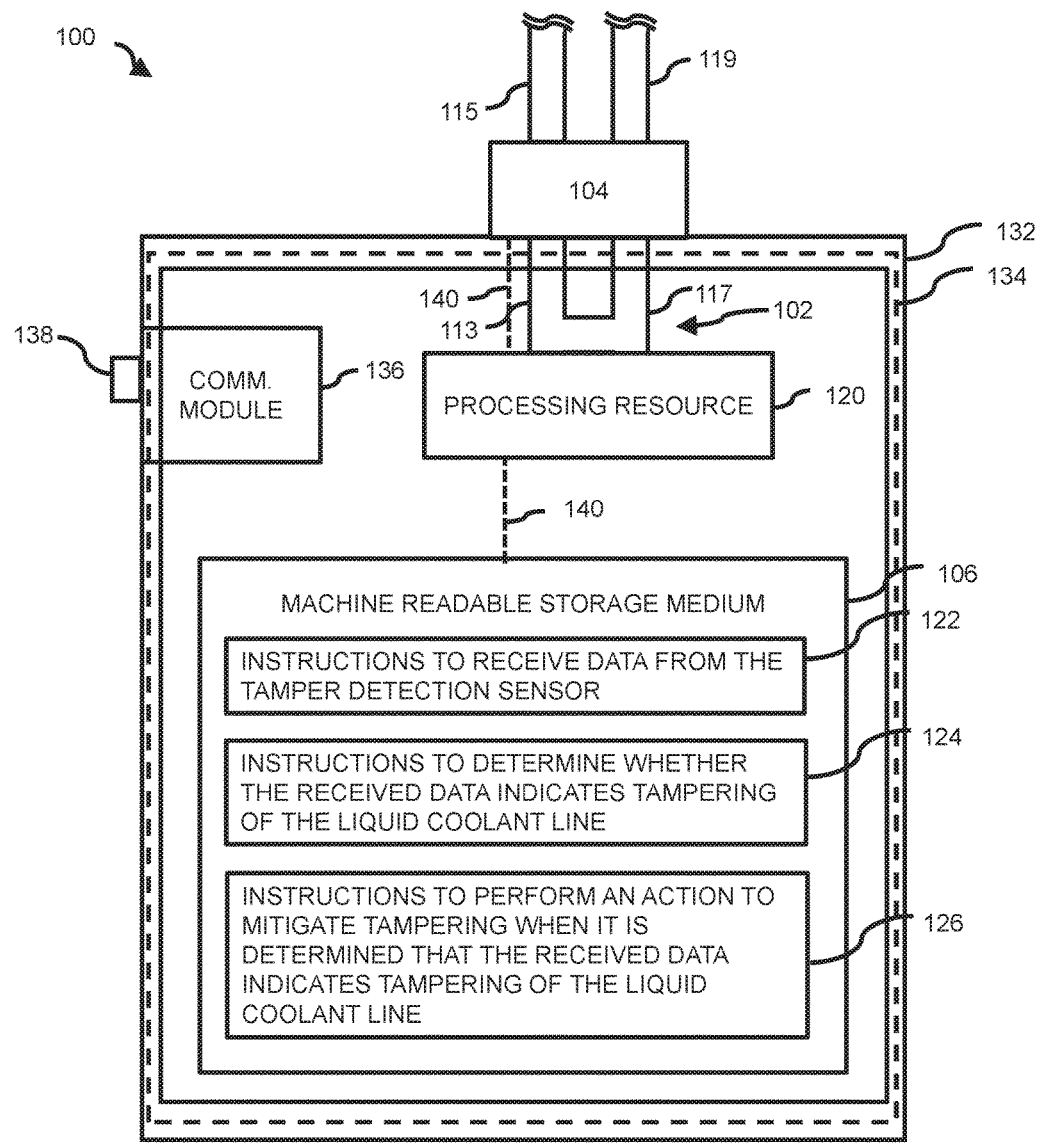
FIG. 9 is a diagram of a computing system according to another example.

FIGS. 8-9 depict an example liquid cooling security system 100. System 100 of FIGS. 8-9 includes a tamper detection sensor 116, such as for example a temperature or flow sensor within coolant security monitor 104, coupled to liquid coolant line 102 of computing system 100 to detect tampering of a liquid coolant line 102. System 100 also includes a non-transitory machine readable storage medium 106 having stored thereon machine readable instructions to cause a computer processor (processing resource 120 of FIG. 9) to: (1) receive data from tamper detection sensor 116 (instructions 122); (2) determine whether the received data indicates tampering of the liquid coolant line (instructions 124); and (3) perform an action to mitigate tampering when it is determined that the received data indicates tampering of the liquid coolant line (instructions 126).

In some implementations, computing system 100 can include non-transitory machine readable storage medium 106 having stored thereon machine readable instructions (e.g., instructions 122, 124, 126 etc.), which are described in further detail below. Storage medium 106 can, for example, be in the form of a non-transitory machine-readable storage medium, such as a suitable electronic, magnetic, optical, or other physical storage apparatus to contain or store information such as machine-readable instructions, etc. It is appreciated that other memory resources beyond non-transitory machine-readable storage mediums can be used with certain implementations of the present disclosure. Such instructions can be operative to perform one or more functions described herein. Storage medium 106 can, for example, be housed within the same housing as processing resource 120 for computing system 100, such as within a computing tower case, server rack, or standalone enclosure for computing system 100. In some implementations, storage medium 106 and processing resource 120 are housed in different housings. As used herein, the term "machine-readable storage medium" can, for example, include Random Access Memory (RAM), flash memory, a storage drive (e.g., a hard disk), any type of storage disc (e.g., a Compact Disc Read Only Memory (CD-ROM), any other type of compact disc, a DVD, etc.), and the like, or a combination thereof. In some implementations, storage medium 106 can correspond to a memory including a main memory, such as a Random Access Memory (RAM), where software may reside during runtime, and a secondary memory. The secondary memory can, for example, include a nonvolatile memory where a copy of machine-readable instructions are stored. It is appreciated that both machine-readable instructions as well as related data can be stored on memory mediums and that multiple mediums can be treated as a single medium for purposes of description.

In some implementations, system 100 can include a processing resource 120 to execute one or more instructions stored on medium 106. Processing resource 120 can, for example, be in the form of a central processing unit (CPU), a semiconductor-based microprocessor, a digital signal processor (DSP) such as a digital image processing unit, other hardware devices or processing elements suitable to retrieve and execute instructions stored in a memory resource or storage medium (e.g., medium 106), or suitable combinations thereof. Processing resource 120 can, for example, include single or multiple cores on a chip, multiple cores across multiple chips, multiple cores across multiple devices, or suitable combinations thereof. Processing resource 120 can be functional to fetch, decode, and execute instructions as described herein. As an alternative or in addition to retrieving and executing instructions, processing resource 120 can, for example, include at least one integrated circuit (IC), other control logic, other electronic circuits, or suitable combination thereof that include a number of electronic components for performing the functionality of instructions stored on storage medium 106. The term "logic" can, in some implementations, be an alternative or additional processing resource to perform a particular action and/or function, etc., described herein, which includes hardware, e.g., various forms of transistor logic, application specific integrated circuits (ASICs), etc., as opposed to machine executable instructions, e.g., software firmware, etc., stored in memory and executable by a processor. Processing resource 120 can, for example, be implemented across multiple processing units and instructions may be implemented by different processing units in different areas of system 100.

As provided above, system 100 includes instructions 122 to cause a computer processor of computing system 100 to receive data from tamper detection sensor 116. Such data can, for example, be in the form of data that itself indicates tampering or any other related, relevant, or suitable tamper detection data. For example, in some implementations, the received tamper detection data may not be sufficient to itself indicate tampering by itself, but may be combined with other data accessible by system 100 or another entity to indicate tampering of system 100.

As provided above, system 100 includes instructions 124 to cause a computer processor of computing system 100 to determine whether the received data indicates tampering of liquid coolant line 102. Instructions 124 can be programmed to indicate tampering when the received data indicates that a flow or pressure of liquid coolant within line 102 satisfies certain criteria. In some implementations, instructions 124 may not indicate tampering until it is determined that a flow or pressure of liquid coolant within line 102 satisfies certain criteria for a specific amount of time or other time-based criteria. For example, instructions 124 may instruct a processing resource to wait until criteria for at least one hour before indicating tampering.

In some implementations, instructions 124 can be programmed to indicate tampering based on a combination of received data that indicates tampering and other information. As but one example, instructions 124 can be programmed to indicate tampering when received data indicates tampering only during a specific day of the week. As another example, instructions 124 can be programmed to indicate tampering only when the received data indicates tampering and system 100 detects an attempt at physical intrusion of an enclosure of system 100. As another example, system 100 can include sensors 116, which can, for example be a temperature, flow, pressure etc. sensor) to monitor temperature at one or more inlets and outlets of system 100 to detect and/or take action against a temperature attack on the hardware. In some implementations, system 100 can be programmed such that the detection of abnormal temperatures along with detection of coolant line-based tampering can be sufficient (by itself or with other factors) for instructions 124 of system 100 to indicate tampering.

In some implementations, instructions 124 can be programmed to indicate tampering when no data is received from tamper detection sensor 116. In such an implementation, the received data, can, for example, be in the form of a NULL data set (or other suitable data structure) to indicate that data was not received or is not available. It is appreciate that other such formats may be supplied and that the term "received data" may refer to a failure to receive expected data. In some implementations, such data can refer to data indicating the disabling or other disruption of tamper detection functionality. For example, instructions 124 can be programmed to indicate tampering upon detection of an attempt to remove or damage security monitor 104.

In some implementations, system 100 can indicate tampering upon prolonged operation of backup energy source 130. For example, system 100 can be programmed to indicate tampering when backup energy source 130 is used for more than one hour. This mode can, for example, be enabled after system 100 is successfully installed and such a prolonged power outage is unlikely. As another example, system 100 can be programmed to indicate tampering when backup energy source 130 is used for more than three weeks. This mode can, for example, be enabled when system 100 is shipped and before it is successfully installed. It is appreciated that the specific lengths of time provided herein are merely used as examples and such time-based criteria may be defined according to customer preference or other factors.

Instructions 126 stored on storage medium 106 can, for example, cause a computer processor of computing system 100 to perform an action to mitigate tampering when it is determined that the received data indicates tampering of computing system 100. In some implementations, such an action can be in the form of an alert that tampering has been detected. Such an alert can be in any suitable form, such as an electronic message sent by computing system 100, an audio, visual, or another type of alert, notification, etc. It is appreciated that in some implementations, such an action can be triggered when no data is received or in response to some other error condition.

In some implementations, the action of instructions 126 can be in the form of disabling predetermined functionality of computing system 100. For example, wireless transmission of data for computing system 100 may be disabled in response to a determination of tampering. In some implementations, power input from a power backup cell (e.g., power backup energy source 130 of FIG. 7 and other power sources may be disabled in response to a determination of tampering. Disabling such power sources can, for example, mitigate a threat of tampering by preventing computing system 100 from turning on altogether. In some implementations, the action of instructions 126 can be programmed to render computing system 100 permanently unusable (e.g., "bricking" the system) or otherwise locking the system down. For example, in some implementations, the action of instructions 126 can lock down system 100 until an unauthorized user or other entity unlocks the system. In some implementations, system 100 can be unlocked through the use of a custom hardware and/or software tool.

In some implementations, the action of instructions 126 can be in the form of deleting certain data stored on computing system 100. For example, in some implementations, a class of sensitive data stored on computing system 100 can be deleted in response to a determination of tampering. In some implementations, all data stored on one or more storage mediums within computing system 100 can be deleted. Likewise, in certain situations, all data stored on computing system 100 can be deleted. It is appreciated that in some implementations, data can additionally or alternatively be encrypted, locked down, backed up, etc., in response to a determination of tampering.

In some implementations, instructions 126 can cause a computer processor to perform multiple actions to mitigate tampering. Such multiple actions can be performed sequentially, in parallel, or another suitable timing or order. For example, in some implementations, a first action can be in the form of a notification to a local and/or remote IT administrator or other suitable entity and a second action, performed in parallel with the first action, can be in the form of deleting sensitive data from computing system 100. It is appreciated that any number of actions can be performed to mitigate tampering.

In some implementations, system 100 can be configured with a cryptographic key. If security is compromised in transit, the key can be "zeroed" by security measures within system 100. When the equipment is installed at its usage location, the key is used to generate an encrypted one-time key during a startup process, which can, for example, be transmitted back to the customer for validation. This can, in some situations, be used to ensure that tamper detection has not been triggered and the unit has maintained security throughout delivery and setup.

In some implementations, computing system 100 can include an enclosure housing 132. Such an enclosure housing 132 can, in some implementations, merely enclose one or more components of computing system 100 and prevent against electrical shock, water, dust, or other environmental threats. In some implementations, enclosure housing 132 can include one or more features to prevent or mitigate tampering with components of computing system 100. For example, certain implementations of the present disclosure can provide for tamper resistant airflow and cable egress. In some implementations, the enclosure may only expose certain connections, such as panel mount power and networking connections.

Certain implementations of the present disclosure are directed to a hardened standalone enclosure, which can be capable of supporting 12U of computational resources or another suitable configuration. In some implementations, the enclosure can be a 10U compute general purpose rack server. The enclosure can, for example, be constructed of steel or other suitable material or combination of materials. In some implementations, enclosure housing 132 can include a lock to prevent the opening of housing 132 without a key. It is appreciated that housing 132 can include additional or alternative security features.

For example, in some implementations, housing 132 may include an intrusion tamper detection barrier (e.g., barrier 134 of FIG. 9). Barrier 134 can, for example, be disposed within housing 132 to detect intrusion of a foreign object in the enclosure housing. Intrusion detection can rely on a conductive layer of Mylar or another suitable foil, a flex circuit, Indium Tin Oxide, conductive ink, etc. In some implementations, the use of such a barrier can provide for active monitoring. Such active monitoring can additionally or alternatively be provided through the use of mechanisms such as a flexible circuit, conductive ink on polyester, etc.

In some implementations, computing system 100 can include an enclosure housing 132. Such an enclosure housing 132 can, in some implementations, merely enclose one or more components of computing system 100 and prevent against electrical shock, water, dust, or other environmental threats. In some implementations, enclosure housing 132 can include one or more features to prevent or mitigate tampering with components of computing system 100. For example, certain implementations of the present disclosure can provide for tamper resistant airflow and cable egress. In some implementations, the enclosure may only expose certain connections, such as panel mount power and networking connections.

In some implementations, barrier 134 can be in the form of an electrically conductive mesh that can provide an electrical signal to a component (e.g., processing resource 120 of FIG. 9) of system 100 when the mesh is damaged, disturbed, or another criteria is met. As depicted for example in FIG. 9, a mesh or other tamper detection barrier 134 can line an entire interior of housing 132 (e.g., along a panel of housing 132), as well as along ports, vents, and other points of entries.

It is appreciated that one or more components, modules of components, or portions of components can be disposed inside of the intrusion tamper detection barrier 134. For example, in some implementations, one or more components of tamper detection sensor 116 can be at least partially exterior to an intrusion tamper detection barrier, as shown for example in FIG. 9.

System 100 of FIG. 9 can include a Top of Rack (TOR), interconnect module, or other network communication module 136 in communication with one or more network connections of system 100. In some implementations, module 136 can allow for networked communication with other equipment. Module 136 can, for example, include a network interface controller having a port 138, such as an Ethernet port and/or a Fibre Channel port. In some implementations, module 136 can include wired or wireless communication interface, and in some implementations, can provide for virtual network ports. In some implementations, module 136 includes hardware in the form of a hard drive, related firmware, and other software for allowing the hard drive to operatively communicate with other network equipment. Module 136 can, for example, include machine-readable instructions for use with communication the communication module, such as firmware for implementing physical or virtual network ports.

As used herein, the term "module" refers to a combination of hardware (e.g., a processor such as an integrated circuit or other circuitry) and software (e.g., machine- or processor-executable instructions, commands, or code such as firmware, programming, or object code). A combination of hardware and software can include hardware only (i.e., a hardware element with no software elements), software hosted at hardware (e.g., software that is stored at a memory and executed or interpreted at a processor), or hardware and software hosted at hardware. It is further appreciated that the term "module" is additionally intended to refer to one or more modules or a combination of modules. Each module of system 100 can, for example, include one or more machine-readable storage mediums and one or more computer processors.

Storage medium 106 can be in communication with monitor 104 or another component of system 100 via a communication link 140. Each communication link 140 can be local or remote to a machine (e.g., a computing device) associated with processing resource 120. Examples of a local communication link 140 can include an electronic bus internal to a machine (e.g., a computing device) where storage medium 106 is one of volatile, non-volatile, fixed, and/or removable storage medium in communication with processing resource 120 via the electronic bus.

While certain implementations have been shown and described above, various changes in form and details may be made. For example, some features that have been described in relation to one implementation and/or process can be related to other implementations. In other words, processes, features, components, and/or properties described in relation to one implementation can be useful in other implementations. Furthermore, it should be appreciated that the systems and methods described herein can include various combinations and/or sub-combinations of the components and/or features of the different implementations described. Thus, features described with reference to one or more implementations can be combined with other implementations described herein. As used herein, "a" or "a number of" something can refer to one or more such things. For example, "a number of widgets" can refer to one or more widgets.

What is claimed is:

1. A computing system comprising:
   a liquid coolant line to circulate liquid through the computing system to cool an electronic component of the computing system;
   a coolant security monitor coupled to the liquid coolant line to detect interior tampering of the coolant line.

2. The system of claim 1, wherein the coolant security monitor is to monitor changes in a flow of coolant within the coolant line to detect interior tampering of the coolant line.

3. The system of claim 1, wherein the coolant security monitor is to monitor changes in a pressure of coolant within the coolant line to detect interior tampering of the coolant line.

4. The system of claim 1, wherein the coolant security monitor is to detect the presence of a foreign object inserted within the coolant line to detect interior tampering of the coolant line.

5. The system of claim 1, wherein the coolant line includes a gate that is sized to prevent passage of foreign objects through the cooling line while allowing coolant to flow through the coolant line.

6. The system of claim 5, wherein the gate is in the form of a security mesh.

7. The system of claim 5, wherein the gate is electrically coupled to the coolant security module to notify the coolant security module of coolant line tampering.

8. The system of claim 1, wherein the coolant line includes:
   an inlet region where the coolant line enters an exterior enclosure of the computing system, and
   an outlet region where the coolant line exits an exterior enclosure of the computing system.

9. The system of claim 8, wherein the coolant security monitor is coupled to the liquid coolant line to detect interior tampering of the coolant line at both the inlet region and the outlet region.

10. A liquid cooling security system comprising:
    a tamper detection sensor coupled to a liquid coolant line of a computing system to detect tampering of a liquid coolant line; and
    a non-transitory machine readable storage medium having stored thereon machine readable instructions to cause a computer processor to:
    receive data from the tamper detection sensor;
    determine whether the received data indicates tampering of the liquid coolant line; and
    perform an action to mitigate tampering when it is determined that the received data indicates tampering of the liquid coolant line.

11. The system of claim 10, wherein the received data corresponds to a flow of liquid coolant through the liquid coolant line.

12. The system of claim 10, wherein the action includes sending an alert that tampering of the coolant line has been detected.

13. The system of claim 10, wherein the action includes disabling predetermined functionality of the computing system.

14. A computing system comprising:
    an exterior enclosure for the computing system;
    an electrical component within the enclosure;
    an interior cooling line within the enclosure to circulate coolant past the electrical component to remove heat generated by the electrical component; and
    an inlet coolant line port through the exterior enclosure to receive an inlet coolant line;
    wherein the inlet coolant line port includes a sensor to detect tampering with an interior of the inlet coolant line.

15. The computing system of claim 14, further comprising:
    an outlet coolant line port through the exterior enclosure to receive an outlet coolant line,
    wherein the outlet coolant line port includes a sensor to detect tampering with an interior of the outlet coolant line.

* * * * *